(12) United States Patent
Hsu (10) Patent No.: US 8,604,362 B2
(45) Date of Patent: Dec. 10, 2013

(54) WATERPROOF ASSEMBLY AND DEVICE EMPLOYING THE SAME

(75) Inventor: Shih-Chang Hsu, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 156 days.

(21) Appl. No.: 13/244,641

(22) Filed: Sep. 25, 2011

(65) Prior Publication Data

US 2013/0025932 A1    Jan. 31, 2013

(30) Foreign Application Priority Data

Jul. 28, 2011    (TW) .................................. 100213895

(51) Int. Cl.
*H02G 3/18*    (2006.01)

(52) U.S. Cl.
USPC ............ 174/653; 174/650; 174/652; 174/656; 16/2.1; 16/2.2

(58) Field of Classification Search
USPC ............ 174/50, 53, 57, 650, 17 R, 18, 17 CT, 174/520, 535, 539, 559, 564, 656, 152 G, 174/153 G, 152 R, 653, 652, 657, 135; 220/3.2–3.9, 4.02; 16/2.1, 2.2; 248/49, 248/56
See application file for complete search history.

(56) References Cited

U.S. PATENT DOCUMENTS

| | | | |
|---|---|---|---|
| 4,835,342 A * | 5/1989 | Guginsky | 174/653 |
| 5,811,728 A * | 9/1998 | Maeda | 174/152 G |
| 5,920,035 A * | 7/1999 | Haney et al. | 174/152 G |
| 6,268,565 B1 * | 7/2001 | Daoud | 174/657 |
| 6,743,980 B2 * | 6/2004 | Milanowski et al. | 174/135 |
| 7,132,605 B2 * | 11/2006 | Holmberg et al. | 174/50 |
| 7,937,818 B2 * | 5/2011 | Holmberg et al. | 174/50 |
| 7,977,585 B2 * | 7/2011 | Yoshizawa et al. | 174/152 G |
| 8,273,985 B2 * | 9/2012 | Lin | 174/50 |

* cited by examiner

*Primary Examiner* — Angel R Estrada
(74) *Attorney, Agent, or Firm* — Altis Law Group, Inc.

(57) ABSTRACT

A device includes a cover defining a sleeve, which allows a transmission cable to pass therethrough such that the transmission cable passes from an inner side of the device to an outer side of the device. An elastomer is filled in the sleeve and embedded with the transmission cable. A fastening member is employed to engage with the sleeve to tightly press the elastomer embedded with the transmission cable to prevent water from entering the device along the transmission cable and the sleeve.

19 Claims, 10 Drawing Sheets

WATERPROOF ASSEMBLY AND DEVICE EMPLOYING THE SAME

BACKGROUND

1. Technical Field

The present disclosure relates to a device, and more particularly to a waterproof assembly of the device.

2. Description of Related Art

Generally, a device should meet certain waterproof requirements to prevent electrical elements in an enclosure of the device from being damaged by water or moisture. However, the enclosure of the device must comprise one or more holes to allow transmission cables passing through to communicate the device with other devices.

One method to waterproof the holes in the enclosure is to use gasket rings engaged between the transmission cables and the holes. With the method, a special tool is needed to mount the gasket rings between the transmission cables and the holes using uniform pressure, and tolerances between the transmission cables and the holes are required to be accurately controlled to avoid failures. Therefore, it is difficult to assemble the device using the gasket ring for waterproofing.

Therefore, a need exists in the industry to overcome the described limitations.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
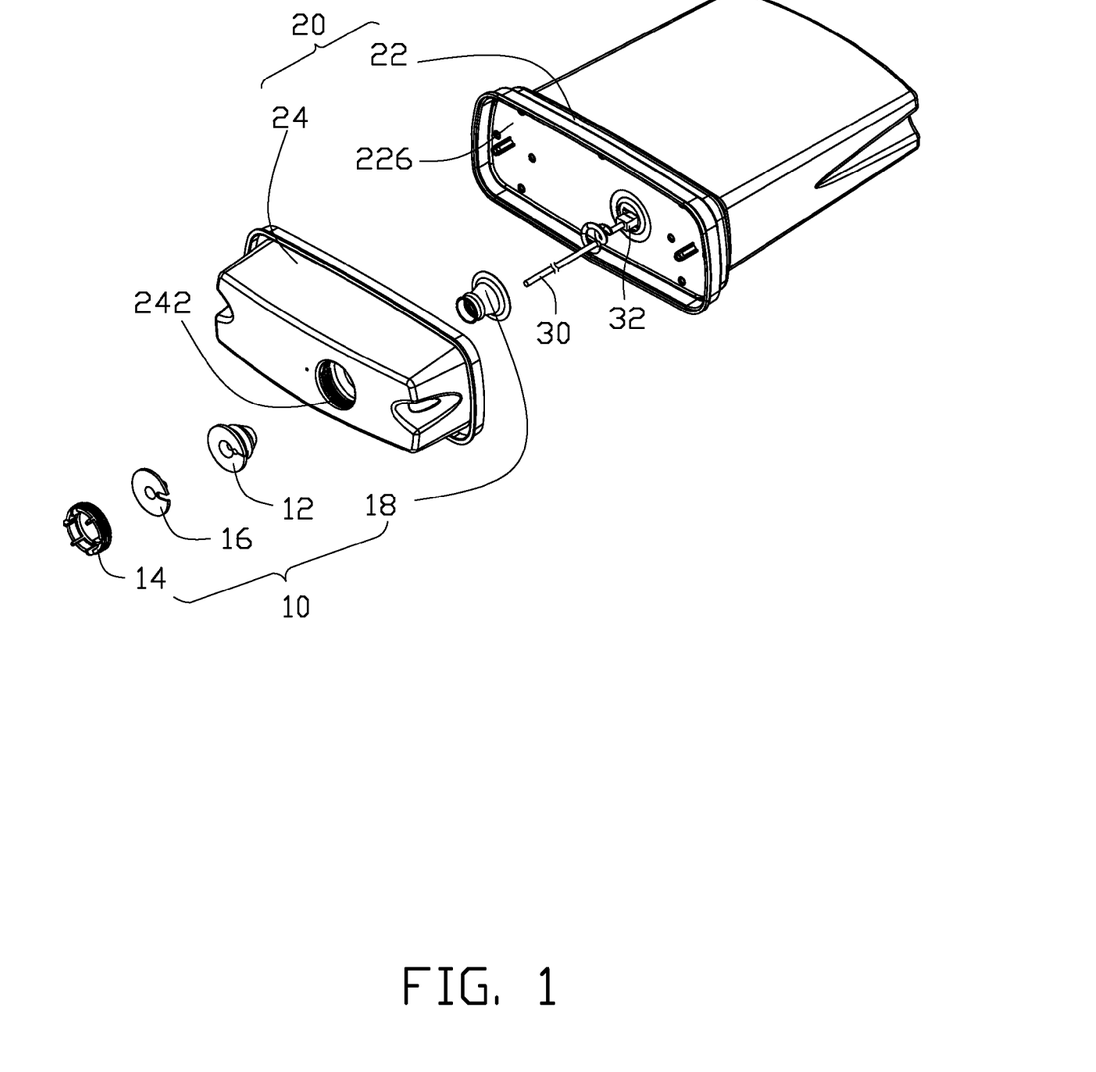
FIG. 1 is an exploded, isometric view of a waterproof assembly employed in a device of an exemplary embodiment of the disclosure.
Figure 2:
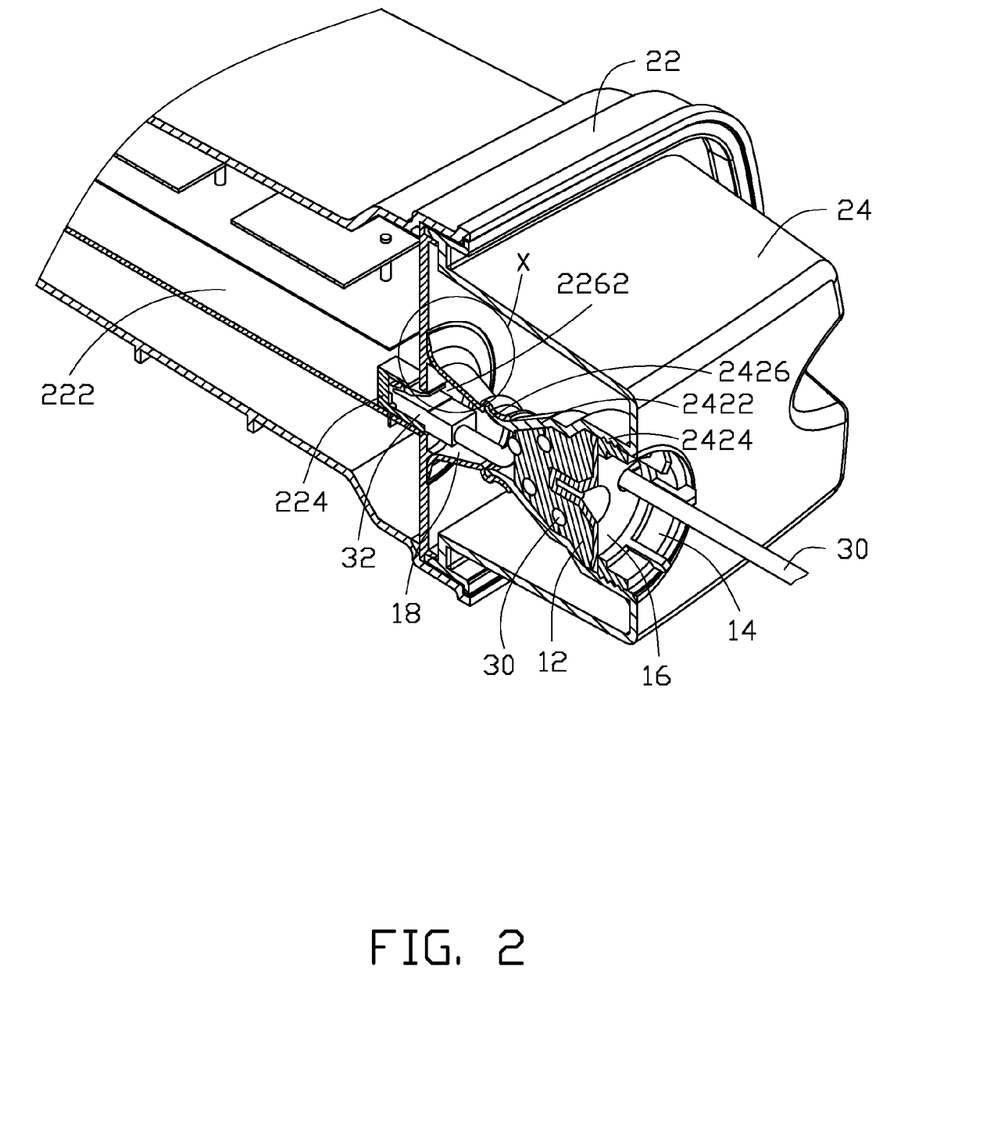
FIG. 2 is a cut-away view of the waterproof assembly employed in the device of FIG. 1.

Referring to FIG. 1, and FIG. 2, a device 20 communicates with other electronic devices via transmission cable 30. The device 20 comprises a shell 22, a cover 24 mounted to the shell 22 and a waterproof assembly 10 mounted to the cover 24. The transmission cable 30 connected with a female connector 32 passes through the cover 24. A male connector 224 electrically connected to a printed circuit board (PCB) 222 installed in the shell 22 engages with the female connector 32. In this embodiment, the shell 22 comprises a fixing board 226 defining a through hole 2262, and the male connector 224 is disposed on one edge of the PCB 222 and opposite to the through hole 2262. The waterproof assembly 10 is used to prevent water, dust, and moisture from entering into the inner of the shell 22 of the device 20 along the transmission cable 30. The device 20, due to the waterproof assembly 10, can be positioned and used outdoors.

Figure 3:
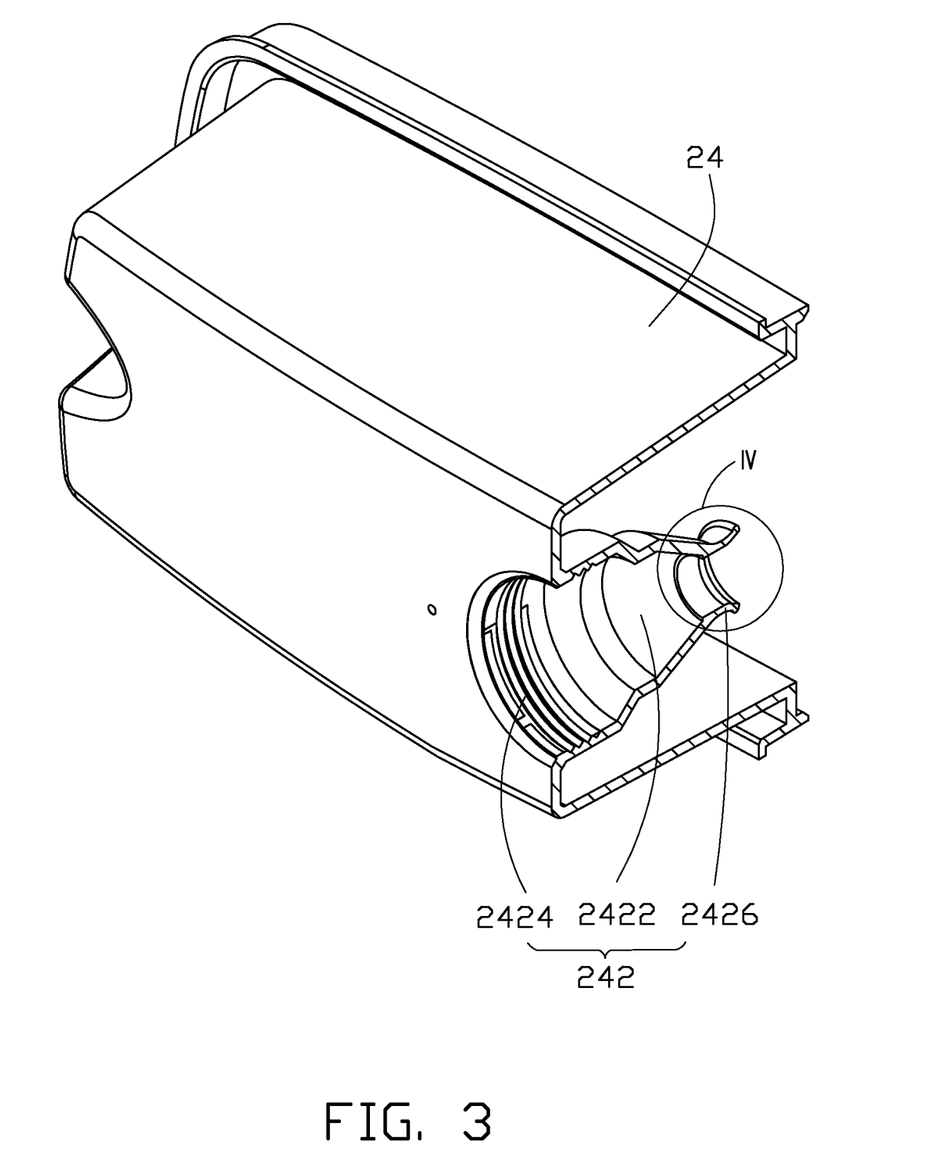
FIG. 3 is a cut-away view of a cover of the device of FIG. 1.

The cover 24 is mounted to the shell 22 at edges of the fixing board 226 with waterproof materials sealed between the cover 24 and the shell 22. Referring to FIG. 3, the cover 24 comprises a sleeve 242, through which the transmission cable 30 passes. The sleeve 242 allows the transmission cable 30 to pass therethrough such that the transmission cable 30 passes from an inner side of the device 20 to an outer side of the device 20. The sleeve 242 comprises a fastening portion 2424 and a receiving portion 2422 extending from the fastening portion 2424 toward the shell 22. In one embodiment, the receiving portion 2422 incrementally increases in size from one end of the receiving portion 2422 close to the shell 22 to the other end of the receiving portion 2422 connected to the fastening portion 2424. In this embodiment, the sleeve 242 has an axial symmetrical structure and is positioned opposite to the through hole 2262 of the shell 22.

Figure 5:
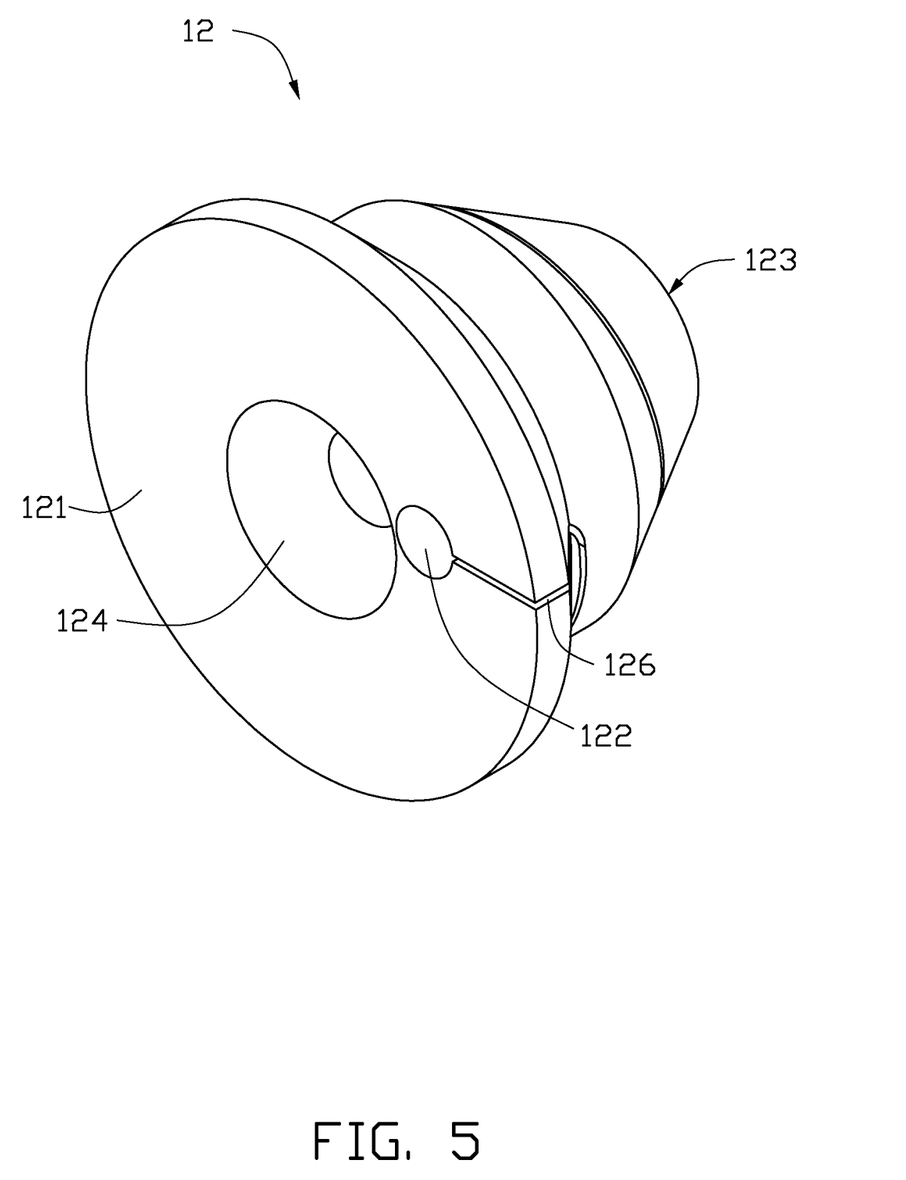
FIG. 5 is a perspective view of an elastomer of the waterproof assembly of FIG. 1.
Figure 6:
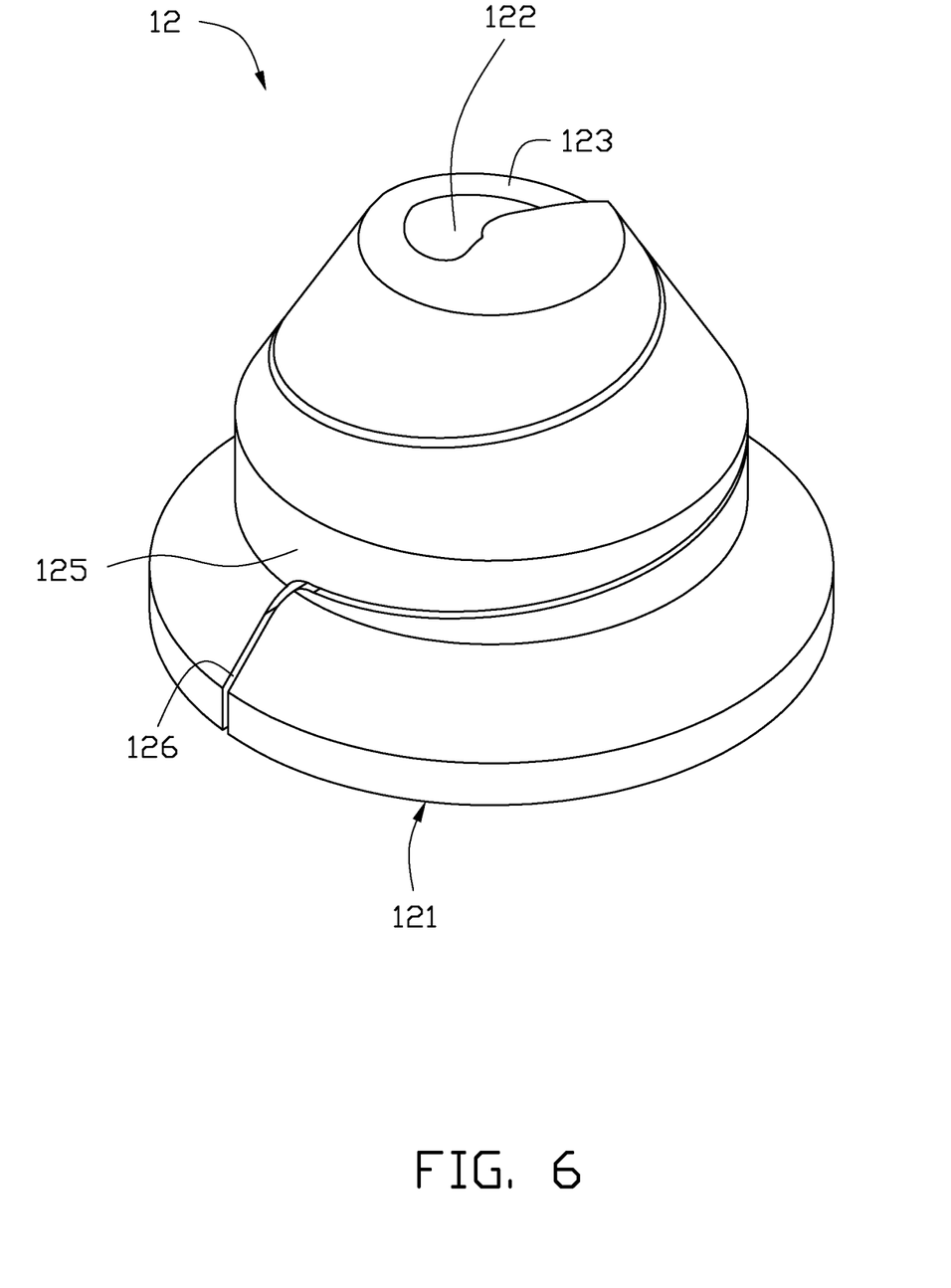
FIG. 6 is a perspective view of the elastomer of the waterproof assembly of FIG. 5, shown from another direction.

The waterproof assembly 10 comprises an elastomer 12 received in the receiving portion 2422 of the sleeve 242 and a fastening member 14, which is hollow and employed to engage with the fastening portion 2424 of the sleeve 242. Referring to FIG. 5 and FIG. 6, the elastomer 12 comprises a first end 121 away from the shell 22, a second end 123 close to the shell 22 and an outer surface 125 tightly contacting an inner surface of the receiving portion 2422. The elastomer 12 defines a through hole 122 spirally extended from the first end 121 to the second end 123 and communicating with an exterior of the elastomer 12 via a gap 126, through which the transmission cable 30 is installed into the through hole 122. That is, the gap 126 communicates between the through hole 122 and the outer surface 125. On the first end 121, the through hole 122 is configured at a middle portion between a center and an edge of the first end 121. On the second end 123, the through hole 122 is configured at a center of the second end 123. That is, the elastomer 12 is filled in the sleeve 242 and embedded with the transmission cable 30 to form a waterproof structure.

The fastening member 14 engages with the fastening portion 2424 of the sleeve 242 to tightly press the elastomer 12 embedded with the transmission cable 30, so as to provide tight contacts respectively between the transmission cable 30 and the elastomer 12 and between the elastomer 12 and the sleeve 242. Therefore, the waterproof assembly 10 can prevent water, dust, and moisture from entering into the inner of the shell 22 of the device 20 along the transmission cable 30 and the sleeve 242. In addition, the waterproof assembly 10 make a longer waterproof path between the elastomer 12 and the transmission cable 30 due to the through hole 122 spirally extended in the elastomer 12.

Figure 7:
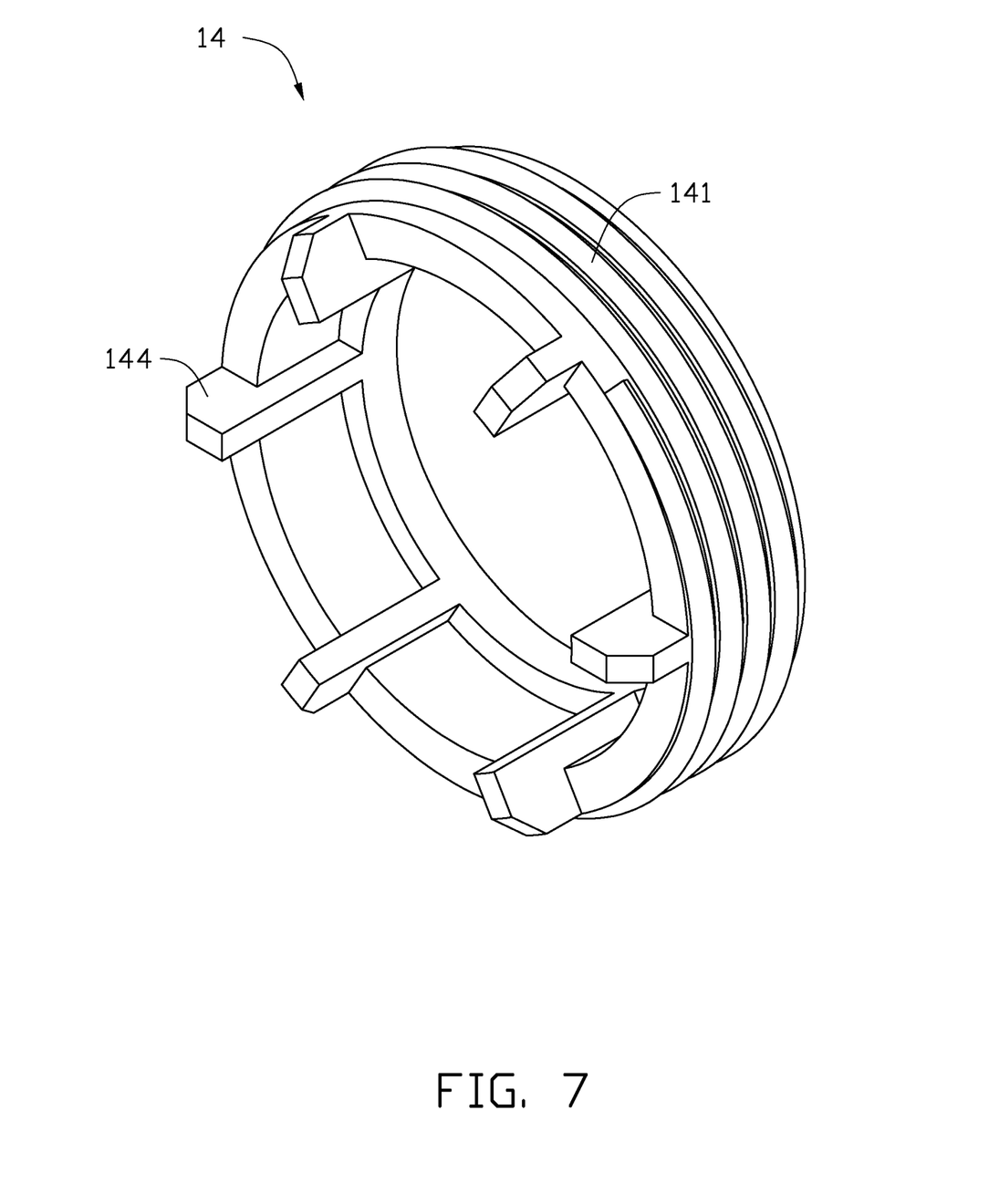
FIG. 7 is a perspective view of a fastening member of the waterproof assembly of FIG. 1.

In this embodiment, the fastening member 14 is screwed into the fastening portion 2424 of the sleeve 242. Referring to FIG. 7, the fastening member 14 comprises a screw portion 141 configured on a periphery of the fastening member 14, and a plurality of protrusions 144 configured on one side of the fastening member 14 away from the elastomer 12 and toward an exterior of the cover 24. In one embodiment, the plurality of protrusions 144 can act as handles for an operator to rotate the fastening member 14. The fastening member 14 can be rotated relative to the fastening portion 2424 to move in the sleeve 242 to deform the elastomer 12 to tightly contact the receiving portion 2422 and the transmission cable 30.

Figure 8:
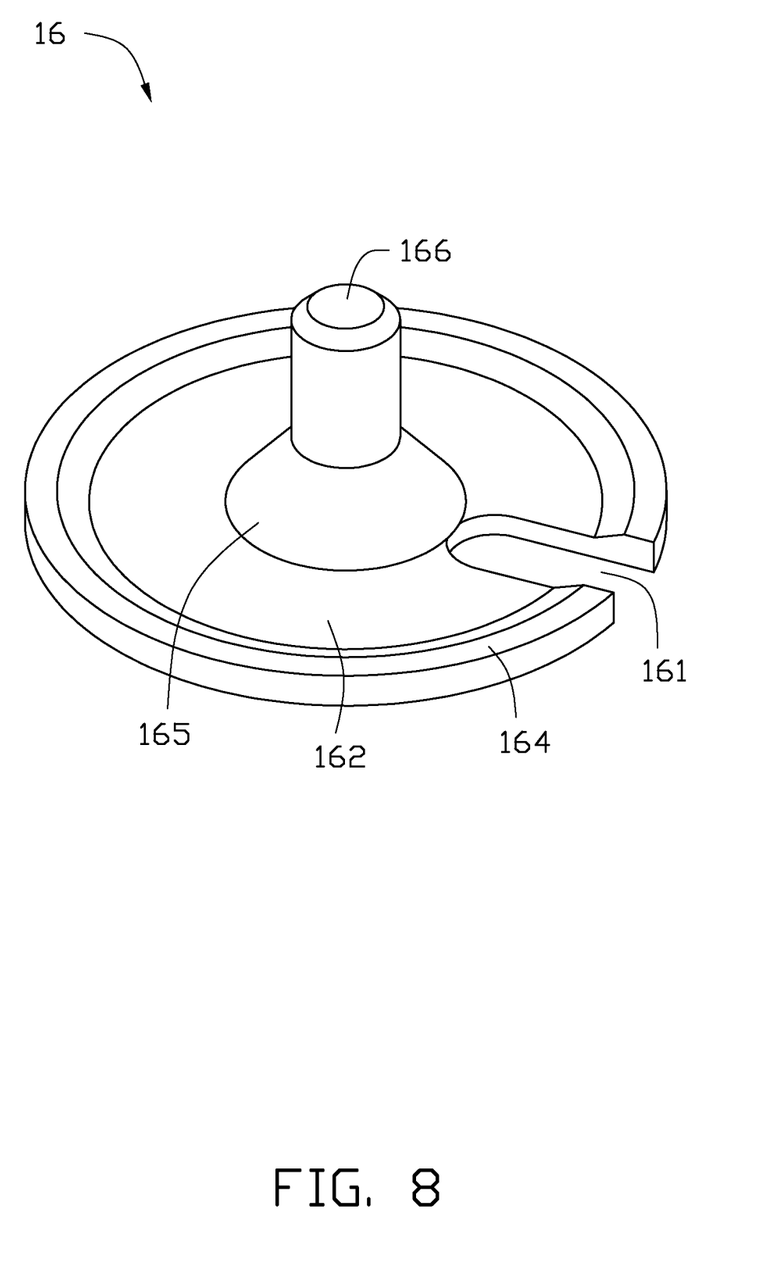
FIG. 8 is a perspective view of a securing member of the waterproof assembly of FIG. 1.

In this embodiment, the waterproof assembly 10 further comprises a securing member 16 connected to the first end 121 of the elastomer 12. Referring to FIG. 8, the securing member 16 comprises a base plate 162 and a securing post 166 protruding from the base plate 162 and inserted into a central hole 124 defined in the elastomer 12. The base plate 162 defines a notch 161 opposite to the through hole 122 of the elastomer 12 for the transmission cable 30 to pass through. The securing member 16 further comprises a connecting portion 165, as a cone shape, connected between the base plate 162 and the securing post 166. The connecting portion 165 and the securing post 166 are received in the central hole 124 in common. The base plate 162 contacts the first end 121 of the elastomer 12.

The base plate 162 comprises a convex flange 164 facing the elastomer 12. The convex flange 164 contact edges of the first end 121 of the elastomer 12. The securing member 16 provides a rigid support for the elastomer 12, so as to focus distortion of the elastomer 12 around the through hole 122 and the gap 126, and make a tight contact between the elastomer 12 and the transmission cable 30.

Figure 4:
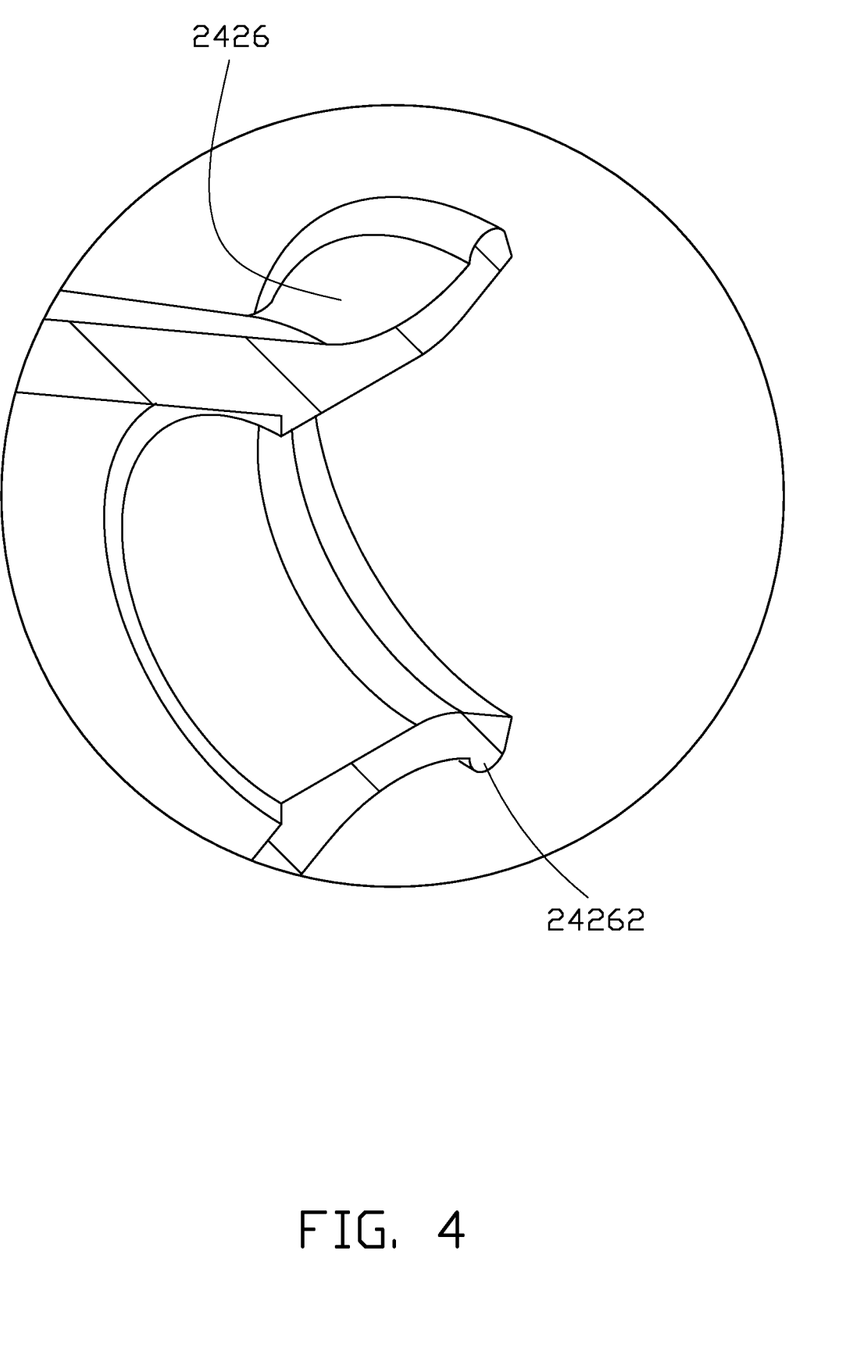
FIG. 4 is an enlarged perspective view of a part labeled as IV shown in FIG. 3.
Figure 9:
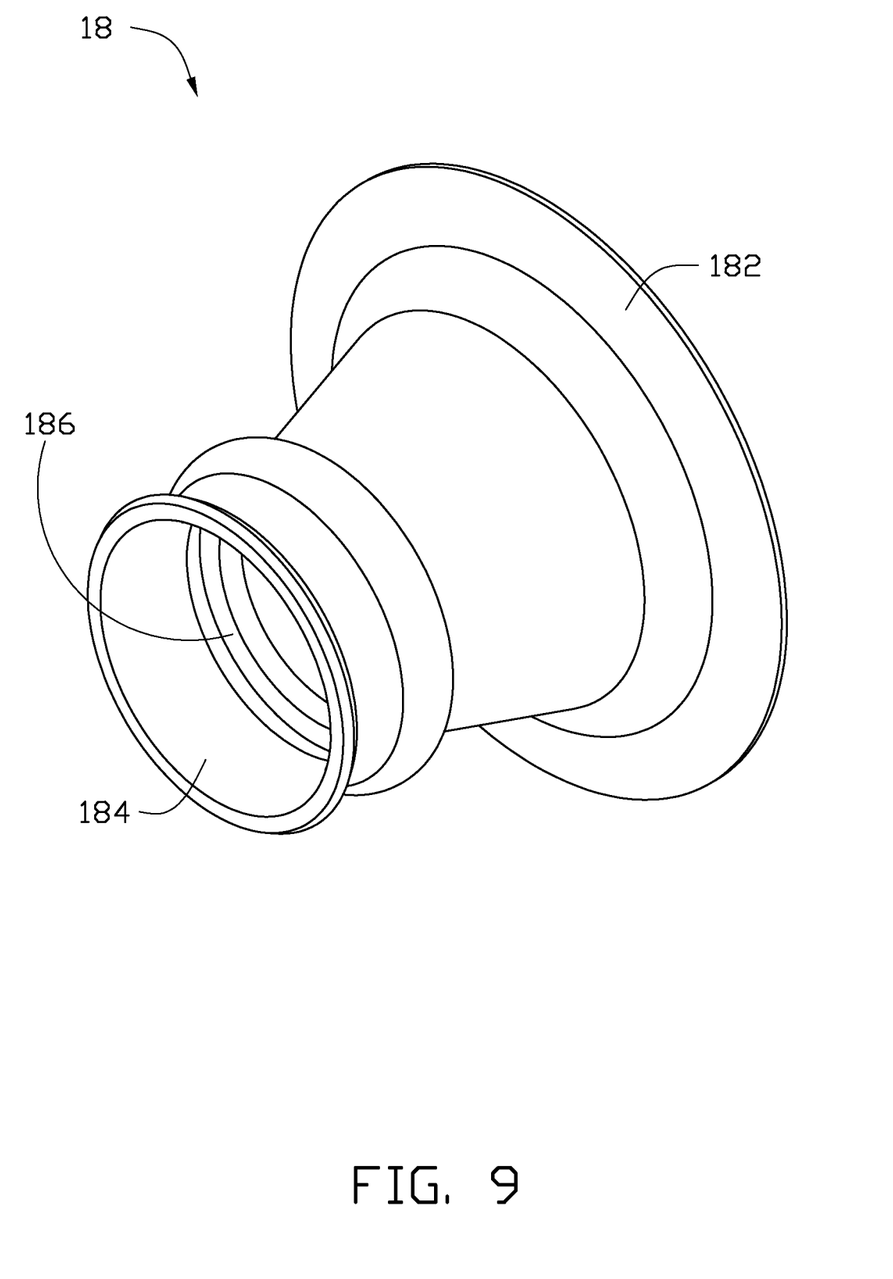
FIG. 9 is a perspective view of a protecting sleeve member of the waterproof assembly of FIG. 1.

In this embodiment, the waterproof assembly 10 further comprises a protecting sleeve 18 comprising a first end 184 and a second end 182. The first end 184 is connected to the sleeve 242 of the cover 24, and the second end 182 urges the shell 22 to shield the male connector 224. Referring to FIG. 9, the sleeve 242 of the cover 24 comprises a connecting portion 2426 inserted into the first end 184 of the protecting sleeve 18. Referring to FIG. 4, the connecting portion 2426 comprises a hook 24262 protruding outwardly along a radial direction and engaging with a groove 186 defined in the first end 184 to secure the protecting sleeve 18 to the sleeve 242.

Figure 10:
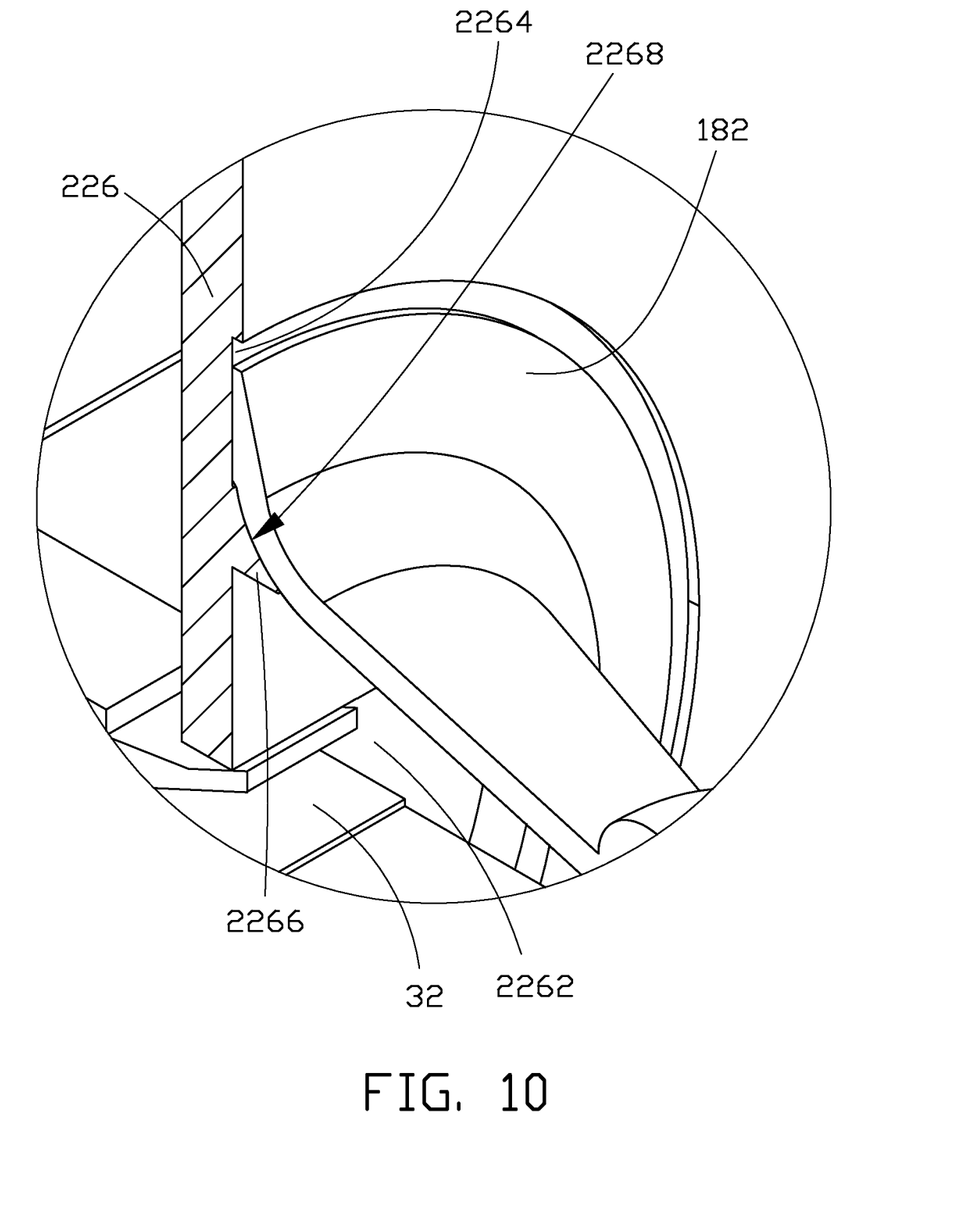
FIG. 10 is an enlarged perspective view of a part labeled as X shown in FIG. 2.

Referring to FIG. 10, the fixing board 226 of the shell 22 defines a recess 2264 shaped as an annulus and surrounding the male connector 224. The protecting sleeve 18 is partly received in the recess 2264. That is, the second end 182 of the protecting sleeve 18 is received in the recess 2264. The shell 22 comprises a projecting portion 2266 shaped as an annulus and configured on an inner edge of the recess 2264. The projecting portion 2266 comprises an arc surface 2268 contacting the second end 182 of the protecting sleeve 18. Therefore, a contact surface between the second end 182 of the protecting sleeve 18 is configured as a plane surface continuous with an arc surface, preventing water, dust, and moisture from entering the shell 22 via the through hole 2262 of the fixing board 226.

Although the features and elements of the present disclosure are described as embodiments in particular combinations, each feature or element can be used alone or in other various combinations within the principles of the present disclosure to the full extent indicated by the broad general meaning of the terms in which the appended claims are expressed.

What is claimed is:

1. A waterproof assembly for a device comprising a shell, a cover mounted to the shell and a male connector installed in the shell and engaging with a female connector connected with a transmission cable, the cover comprising a sleeve allowing the transmission cable to pass through, the sleeve comprising a fastening portion and a receiving portion extending from the fastening portion toward the shell, the waterproof assembly comprising:
   an elastomer, received in the receiving portion of the sleeve and comprising a first end away from the shell and a second end close to the shell, the elastomer defining a through hole spirally extended from the first end to the second end and communicating with an exterior of the elastomer via a gap, through which the transmission cable is installed into the through hole; and
   a fastening member, engaging with the fastening portion of the sleeve to tightly press the elastomer.

2. The waterproof assembly as claimed in claim 1, wherein the receiving portion incrementally increases in size from one end of the receiving portion close to the shell to the other end of the receiving portion connected to the fastening portion.

3. The waterproof assembly as claimed in claim 1, wherein the fastening member is screwed into the fastening portion of the sleeve and the fastening member comprises a plurality of protrusions configured on one side of the fastening member away from the elastomer and toward an exterior of the cover.

4. The waterproof assembly as claimed in claim 1, further comprising a securing member connected to the first end of the elastomer, the securing member comprising a base plate and a securing post protruding from the base plate and inserted into a central hole defined in the elastomer, wherein the base plate defines a notch opposite to the through hole of the elastomer for the transmission cable to pass through.

5. The waterproof assembly as claimed in claim 4, wherein the base plate comprises a convex flange facing the elastomer.

6. The waterproof assembly as claimed in claim 4, wherein the securing member further comprises a connecting portion connected between the base plate and the securing post.

7. The waterproof assembly as claimed in claim 1, further comprising a protecting sleeve with one end connected to the sleeve of the cover, and the other end urging the shell to shield the male connector.

8. The waterproof assembly as claimed in claim 7, wherein the sleeve of the cover comprises a connecting portion inserted into the protecting sleeve, the connecting portion comprises a hook protruding outwardly along a radial direction and engaging with a groove defined in the protecting sleeve to secure the protecting sleeve to the sleeve.

9. The waterproof assembly as claimed in claim 7, wherein the shell defines a recess shaped as an annulus and surrounding the male connector, the protecting sleeve partly received in the recess.

10. The waterproof assembly as claimed in claim 9, wherein the shell comprises a projecting portion shaped as an annulus and configured on an inner edge of the recess, and the projecting portion comprises an arc surface contacting the protecting sleeve.

11. A device comprising:
   a cover defining a sleeve;
   the sleeve allowing a transmission cable to pass therethrough such that the transmission cable passes from an inner side of the device to an outer side of the device, an elastomer filled in the sleeve and embedded with the transmission cable, and a fastening member being employed to engage with the sleeve to tightly press the elastomer embedded with the transmission cable to prevent water from entering the device along the transmission cable and the sleeve;
   wherein the elastomer defines a through hole spirally extended in the elastomer and communicating with an exterior of the elastomer via a gap, through which the transmission cable is installed in the through hole.

12. The device as claimed in claim 11, wherein the sleeve comprises a fastening portion and a receiving portion extending from the fastening portion, the receiving portion incrementally increases in size from one end of the receiving portion away from the fastening portion to the other end of the receiving portion connected to the fastening portion, the fastening portion is closed to the outer side of the device, the elastomer is received in the receiving portion, and the fastening member is screwed into the fastening portion.

13. The device as claimed in claim 12, wherein the fastening member comprises a plurality of protrusions configured on one side of the fastening member away from the elastomer and toward an exterior of the cover.

14. The device as claimed in claim 11, wherein the waterproof assembly further comprises a securing member connected to the elastomer and located between the elastomer and the fastening member, the securing member comprises a base plate and a securing post protruding from the base plate and inserted into a central hole defined in the elastomer, and the base plate defines a notch opposite to the through hole of the elastomer for the transmission cable to pass through.

15. The device as claimed in claim 14, wherein the base plate comprises a convex flange facing the elastomer and contacting edges of the elastomer.

16. The device as claimed in claim 11, further comprising a shell, on which the cover is mounted, wherein a male connector is installed to the shell and engages with a female connector connected to the transmission cable, and the waterproof assembly further comprises a protecting sleeve with one end connected to the sleeve of the cover, and the other end urging the shell to shield the male connector.

17. The device as claimed in claim 16, wherein the sleeve of the cover comprises a connecting portion inserted into the protecting sleeve, and the connecting portion comprises a hook protruding outwardly along a radial direction and engaging with a groove defined in the protecting sleeve to secure the protecting sleeve to the sleeve.

18. The device as claimed in claim 16, wherein the shell defines a recess shaped as an annulus and surrounding the male connector, the protecting sleeve partly received in the recess.

19. The device as claimed in claim 18, wherein the shell comprises a projecting portion shaped as an annulus and configured on an inner edge of the recess, and the projecting portion comprises an arc surface contacting the protecting sleeve.

* * * * *